United States Patent
Wang et al.

(10) Patent No.: US 7,545,662 B2
(45) Date of Patent: Jun. 9, 2009

(54) METHOD AND SYSTEM FOR MAGNETIC SHIELDING IN SEMICONDUCTOR INTEGRATED CIRCUIT

(75) Inventors: Chao-Hsiung Wang, Hsin-chu (TW); Horng-Huei Tseng, Hsin-chu (TW); Denny Tang, Saratoga, CA (US); Wen-Chin Lin, Hsin-chu (TW); Mark Hsieh, Chu-Pei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 606 days.

(21) Appl. No.: 11/089,969

(22) Filed: Mar. 25, 2005

(65) Prior Publication Data

US 2006/0229683 A1  Oct. 12, 2006

(51) Int. Cl.
G11C 7/02 (2006.01)

(52) U.S. Cl. ............... 365/53; 257/659; 365/55; 365/66; 365/158; 438/3

(58) Field of Classification Search ............. 438/3; 257/659, 660; 365/53, 56, 66, 158
See application file for complete search history.

(56) References Cited

U.S. PATENT DOCUMENTS

| | | | |
|---|---|---|---|
| 6,555,858 B1 * | 4/2003 | Jones et al. | 257/295 |
| 6,661,071 B2 * | 12/2003 | Lenssen et al. | 257/422 |
| 6,872,993 B1 * | 3/2005 | Zhu et al. | 257/259 |
| 6,940,153 B2 * | 9/2005 | Spencer et al. | 257/659 |
| 7,030,469 B2 * | 4/2006 | Mahadevan et al. | 257/659 |
| 7,477,538 B2 * | 1/2009 | Shimura et al. | 365/158 |
| 2002/0047088 A1 * | 4/2002 | Ishii et al. | 250/214.1 |
| 2002/0167084 A1 * | 11/2002 | Coccioli et al. | 257/732 |
| 2003/0111626 A1 * | 6/2003 | Hosotani | 251/200 |
| 2004/0019272 A1 * | 1/2004 | Witcraft | 600/410 |
| 2004/0032010 A1 * | 2/2004 | Kools et al. | 257/659 |
| 2004/0043519 A1 * | 3/2004 | Sharma et al. | 438/3 |
| 2004/0233010 A1 * | 11/2004 | Akram et al. | 333/1 |

\* cited by examiner

*Primary Examiner*—VanThu Nguyen
*Assistant Examiner*—Alexander Sofocleous
(74) *Attorney, Agent, or Firm*—K & L Gates LLP

(57) ABSTRACT

A circuit with an inter-module radiation interference shielding mechanism is disclosed. The circuit includes a circuit module producing a radiation field. At least one radiation shielding module is situated between the circuit module and another module that is vulnerable to the interference of the radiation field. The shielding module is substantially tangential to the radiation field.

20 Claims, 5 Drawing Sheets

METHOD AND SYSTEM FOR MAGNETIC SHIELDING IN SEMICONDUCTOR INTEGRATED CIRCUIT

BACKGROUND

The present invention relates generally to a method and system of magnetic shielding for preventing interference caused by magnetic components inside semiconductor devices.

The use of magnetic random access memory (MRAM) that uses magnetic components has increased in recent years. MRAM technology typically provides a method of storing data bits using magnetic-resistance effect, which is a departure from the conventional method of storing data bits using electrical charges in such technologies as static random access memory (SRAM) and dynamic random access memory (DRAM). Unlike DRAM and SRAM, MRAM is a non-volatile device that does not require constant electrical power to retain stored information, thereby consuming much less power. This power savings in MRAM are particularly appealing in mobile applications such as mobile computer devices. MRAM is ideal since they not only provide power savings, but typically exhibits higher speed than SRAM, and higher density than DRAM.

However, interference can be a major problem for components like MRAM where a large number of components are compacted into a small area such as an integrated circuit (IC). While many components in the IC have electrical interferences, MRAM also generates magnetic interferences with magnetic fields. A magnetic field may come from sources of magnetic flux, which can be anything from power lines and bar magnets to Earth. Since active circuit elements like bit lines, word lines, and other components that work in parallel with MRAM in an IC environment may generate magnetic fields during operation, they may affect MRAM operations when they are closely placed next to each other. The magnetic fields not only may distort signals within the IC but also induce changes on electrical signals of surrounding circuits connecting through the bonding pads. In fact, this problem is not just for MRAM, it is prevalent for any circuit module that produces inter-module interference.

In order to prevent interference of electromagnetic fields from interrupting operation of the IC that uses magnetic components such as MRAM, proper magnetic shielding within the system needs to be implemented. These barriers are metal with magnetic traits which can be placed between components within the IC. The shielding can attenuate magnetic field of a certain component from reaching another component resulting in less interference.

It is therefore desirable to produce a high performance IC having shielding mechanism for reducing inter-module interferences.

SUMMARY

In view of the foregoing, this invention provides a method and system for shielding magnetic interference inside a semiconductor integrated circuit. A circuit with an inter-module radiation interference shielding mechanism is disclosed. In one embodiment, the circuit includes a circuit module producing a radiation field. At least one radiation shielding module is situated between the circuit module and another module that is vulnerable to the interference of the radiation field. The shielding module is substantially tangential to the radiation field.

The construction and method of operation of the invention, however, together with additional objects and advantages thereof will be best understood from the following descriptions of specific embodiments when read in connection with the accompanying figures.

DESCRIPTION

The present invention provides a method and system for implementing magnetic shields in semiconductor devices to prevent inter-module radiation interferences from affecting the proper functioning of circuit modules or components such as magnetic random access memory (MRAM) cells.

Figure 1:
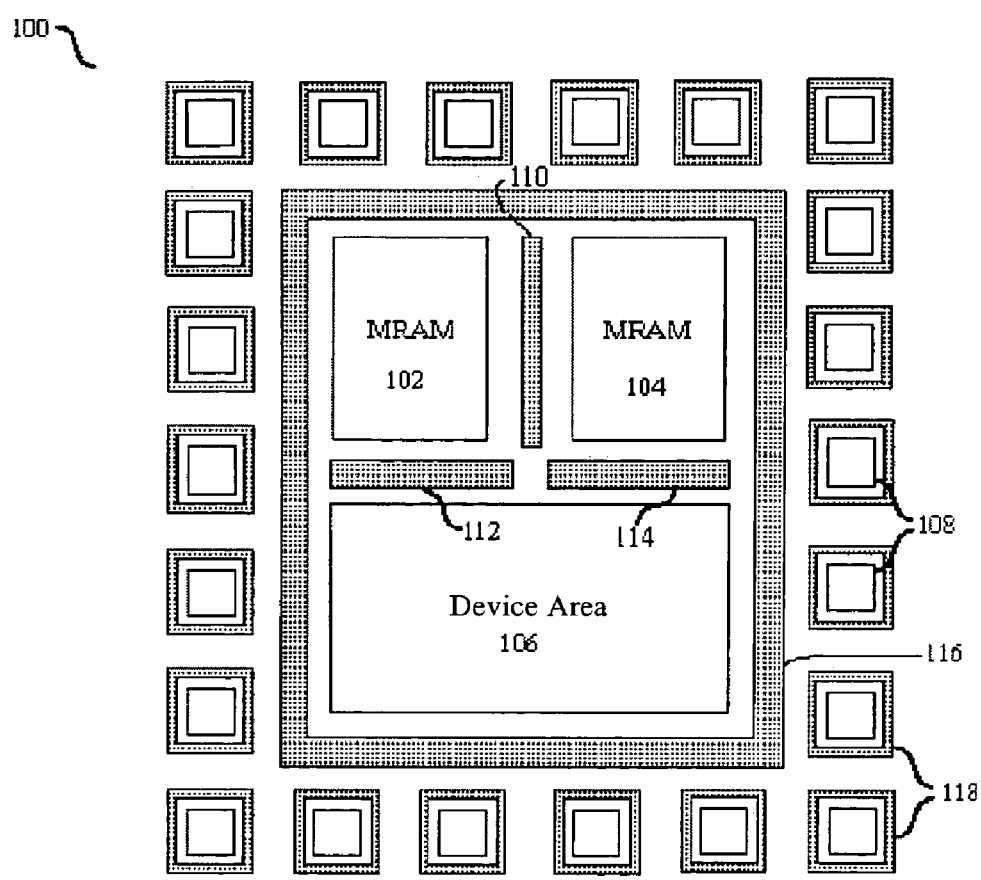
FIG. 1 presents a diagram 100 illustrating how magnetic shielding is placed between components in an integrated circuit in accordance with one embodiment of the present invention.

FIG. 1 illustrates a system 100 wherein magnetic shielding modules for preventing inter-module radiation interference are placed between components in an integrated circuit (IC), according to one embodiment of the present invention. The system 100 includes a first MRAM module 102, a second MRAM module 104, and a device area 106 that may include, for example, logic devices, analog devices, and radio frequency (RF) devices. These components are surrounded by a plurality of bonding or input/output pads 108. The shaded areas in the figure are the magnetic shielding modules that are implemented in this embodiment. The magnetic shielding modules are made of materials, such as, ferrites, manganites, chromites, cobaltites, iron (Fe), magnesium (Mg), manganese (Mn), nickel (Ni), copper (Cu), cobalt (Co), and alloys thereof.

Magnetic shielding modules 110, 112, and 114 provide magnetic interference protection for the first MRAM module 102, second MRAM module 104 and device area 106. Due to the electromagnetic effect, the first MRAM module 102, second MRAM module 104 and device area 106 would induce radiation fields, such as electromagnetic fields. The radiation field can often be expressed as a set of concentric radiation flux. In order to effectively protect the MRAM modules 102, 104 and the device area 106 from radiation interference, it is suggested that the shielding modules are situated in such a manner substantially tangential to the radiation flux. That is, if the radiation flux is drawn as various con-centric curves, a surface of the shielding module facing the source of the radiation flux is substantially tangential to at least one of these curves. For example, the shielding module 110 is substantially tangential to the radiation field of the first MRAM module 102 or the second MRAM module 104, and attenuates inter-module radiation interference therebetween. In a like manner, the shielding module 112 provides a protective barrier between the device area 106 and the first MRAM module 102, while the shielding module 114 provides a protective barrier between the device area 106 and the second MRAM module 104.

The shielding modules 110, 112 and 114 among those components alone may not be enough, since magnetic fields can also interfere parts such as the bonding pads 108 as well. As such, a ring-shaped magnetic shielding module 116, which can be formed either integrally or by several segments, is placed around the centrally located circuit modules. In addition, all the bonding pads 108 are also protected by a plurality of ring-shaped magnetic shielding modules 118, which also can be formed either integrally or by several segments, to avoid radiation interference between the bonding pads 108. The magnetic shielding modules 118 around the bonding pads 108 will also provide protection for other surrounding circuits connecting through the bonding pads 108.

Figure 2:
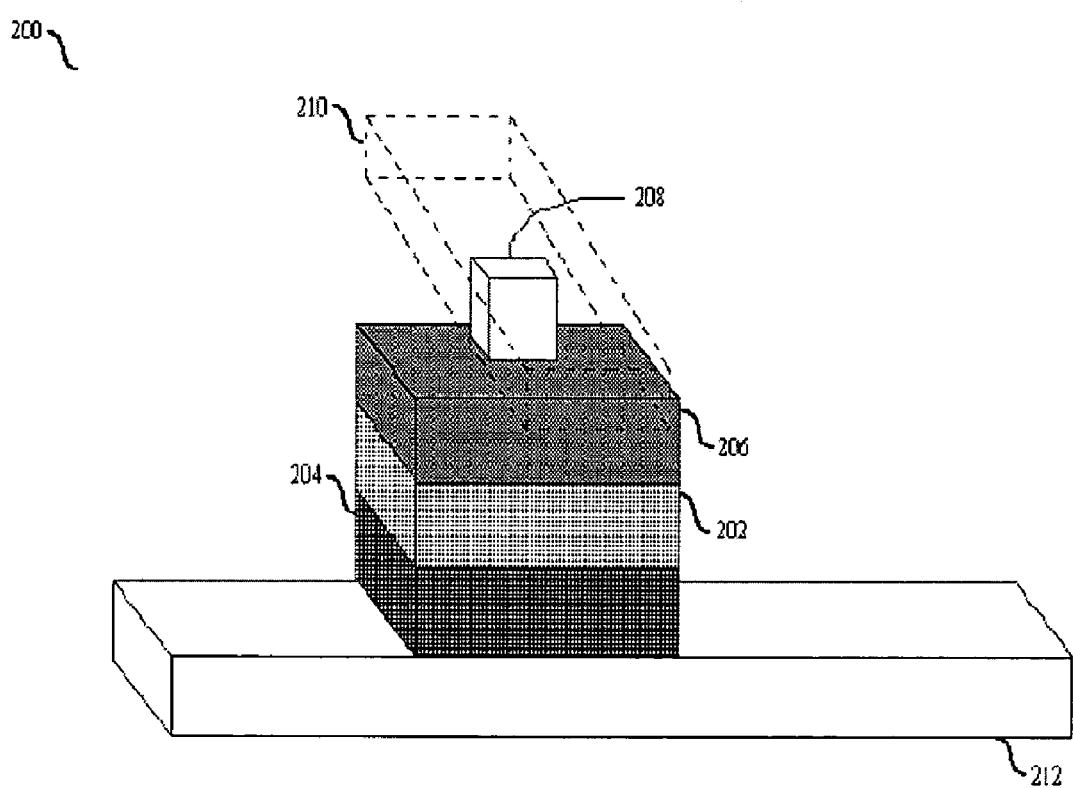
FIG. 2 illustrates a close physical view of a magnetic tunnel junction magnetic random access memory in accordance with one embodiment of the present invention.

FIG. 2 illustrates a close physical view of a magnetic tunnel junction (MTJ) MRAM cell 200 that may be within the first MRAM module 102 or second MRAM module 104 (as shown in FIG. 1) in accordance with one embodiment of the present invention. A memory array of MTJ MRAM cells 200 is one of the sources of magnetic fields that may distort the system during programming and may require shielding in order to avoid magnetic field interference. It is noted that other types of memory cells, such as spin valve magnetic cells, can also be used in the MRAM modules as a source of the magnetic fields causing an undesired magnetic interference.

The logic, analog or RF devices in the device area 106 (shown in FIG. 1) can also be the sources of magnetic fields that may distort the system and may require shielding in order to avoid magnetic field interference. This is particularly true, when a high current flows (greater than 2.0 mA) through the interconnections of those devices. The MTJ MRAM cell is very sensitive to magnetic fields, and a magnetic flux density around 20~50 Oe would change its magnetic dipole state. Thus, in one embodiment of the invention, a radiation shielding structure is used to confine the radiation field produced by a device generating an induced magnetic flux density that is no greater than 50 Oe.

A typical MTJ MRAM cell 200 includes a layer of insulating material or tunneling barrier 202 sandwiched between two electrodes of magnetic material. One electrode is a fixed ferromagnetic layer 204 that creates a strong pinning field to hold the magnetic polarization of the layer in one specific direction. The other electrode is a free ferromagnetic layer 206 which is free to rotate and hold polarization in one of two directions. Free ferromagnetic layer 206 is connected to a top electrode 208, which further connects to a bit line 210, which provides the column value of a memory address. The fixed ferromagnetic layer 204 is connected to a bottom electrode which leads to a word line 212 that controls the row value of the memory address.

Like other types of memory cells, the MTJ MRAM cell has a low state and a high state. When the fixed ferromagnetic layer 204 and the free ferromagnetic layer 206 have the same polarization, the MTJ MRAM cell 200 will have a low resistance state. When their polarizations are not parallel, the MTJ MRAM cell 200 has a high resistance state. The state can be read or detected by having a current flow from one magnetic layer to the other through the tunneling barrier 202. The MTJ MRAM cell 200 has a non-volatile attribute because of how the magnetic layers will stay in position holding its state even if there is no power. Significant power savings may therefore be achieved. The MRAM cells are also extremely small, compared to SRAM cells, and thus allow a higher density configuration, thereby giving a greater storage capacity.

FIGS. 3 through 5C illustrate a process of forming a semiconductor structure 300 in which at least one shielding wall is provided for a cell element in order to prevent an inter-cell radiation interference with another radiation source. In this embodiment, a MTJ MRAM cell is used as the cell element for purposes of illustration. However, it is noted that the shielding wall can be applied to protect other types of semiconductor devices, such as ROM cells, DRAM cells and SRAM cells, from an inter-cell radiation interference.

Figure 3:
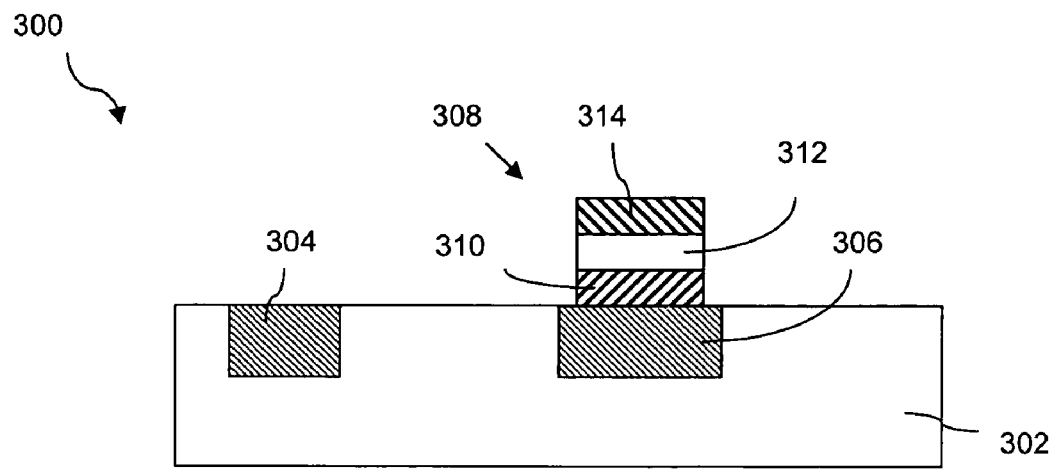
FIGS. 3 through 5C illustrate a process of manufacturing a semiconductor structure 300 in which at least one shielding wall is provided for preventing a radiation interference in accordance with one embodiment of the present invention.

Referring to FIG. 3, a semiconductor substrate 302 is provided, in which a first conductive interconnection 304 and electrode 306 are formed. Trenches are formed in the substrate 302, then a conductive material is filled in the trenches, and finally the surface of the substrate 302 is planarized. Those steps can be achieved by methods, such as etching, photolithography, depositing, and chemical mechanical polishing (CMP). A MTJ MRAM cell 308, including a fixed ferromagnetic layer 310, tunneling barrier 312 and free ferromagnetic layer 314, is formed atop the electrode 306. The MTJ MRAM cell 308 can be achieved by methods, such as deposition, photolithography and etching. The electrode 306 can be a radiation source in this circuit module that may interfere with the function of the conductive interconnection 304.

Figure 4:
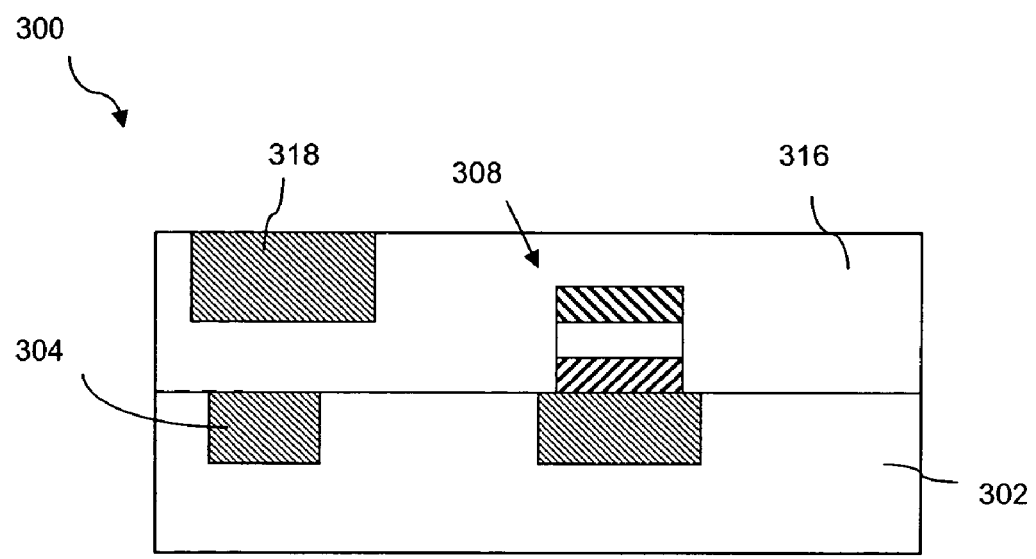

Referring to FIG. 4, a dielectric layer 316 is formed over the MTJ MRAM cell 308. A second conductive layer 318 is formed above the first conductive layer 304 in the dielectric layer 316. The second conductive layer 318 can be formed in the same way as the first conductive layer 304 as described above.

Figure 5A:
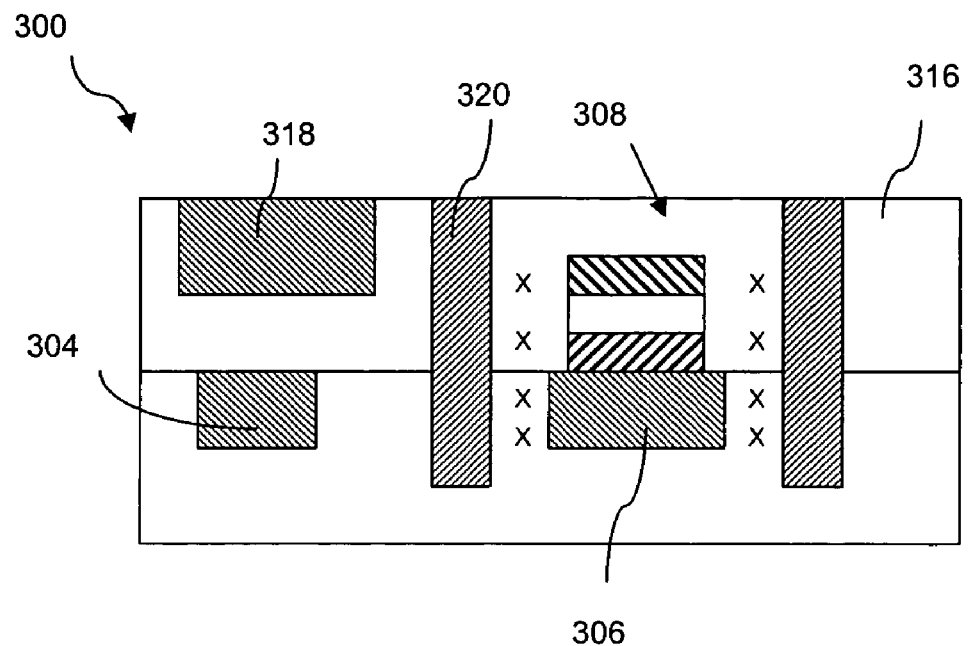

Referring to FIG. 5A, a shielding wall 320 is formed between the electrode 306 and the first conductive interconnection 304 as well as between the MTJ MRAM cell 308 and the second conductive interconnection 318. In forming the shielding wall 320, a trench is formed through the dielectric layer 316 into the substrate 302. A shielding material is filled into the trench by methods, such as deposition. Then, a planarization is performed for leveling the top surface of the dielectric layer 316.

In an alternative process of the embodiment, the shielding wall 320 can be formed in two stages. First, the lower part of the shielding wall 320 is formed in the substrate 302 together with the electrode 306 and the first conductive interconnection 304. The upper part of the shielding module 320 is then formed in the dielectric layer 316 so that the top surface thereof is leveled with the top surface of the electrode 306 and in alignment with the lower part. It is also understood that the upper and lower parts of the shielding modules do not have to be perfectly aligned as long as they do not leave any gap for the magnetic flux to penetrate through. This alternative can achieve a substantially the same result as the one discussed above.

In this embodiment, the electrode 306 is adapted to induce a magnetic field as indicated by the crosses around it. The first conductive interconnection 304 or the second conductive interconnection 318 can act as radiation sources that may cause a radiation interference with the MTJ MRAM cell 308. The shielding walls 320 are situated substantially tangential to the magnetic field of the first conductive interconnection 304 or the second conductive interconnection 318, such that it would effectively prevent the radiation interference. Likewise, the electrode 306 of the MTJ MRAM cell 308 may induce a magnetic field as indicated by the crosses around it. The shielding wall 320 are situated substantially tangential to the magnetic field of the electrode 306 of the MTJ MRAM cell 308, such that it would effectively prevent the radiation interference between the cell 308 and another MTJ MRAM cell, such as the cell 308' shown in FIG. 5B. It is also understood that the two shielding walls shown may have similar geometrical configuration and can be substantially aligned between themselves. The length and width, and the location of the shielding walls are determined by the resulting effect of interference reduction.

Figure 5C:
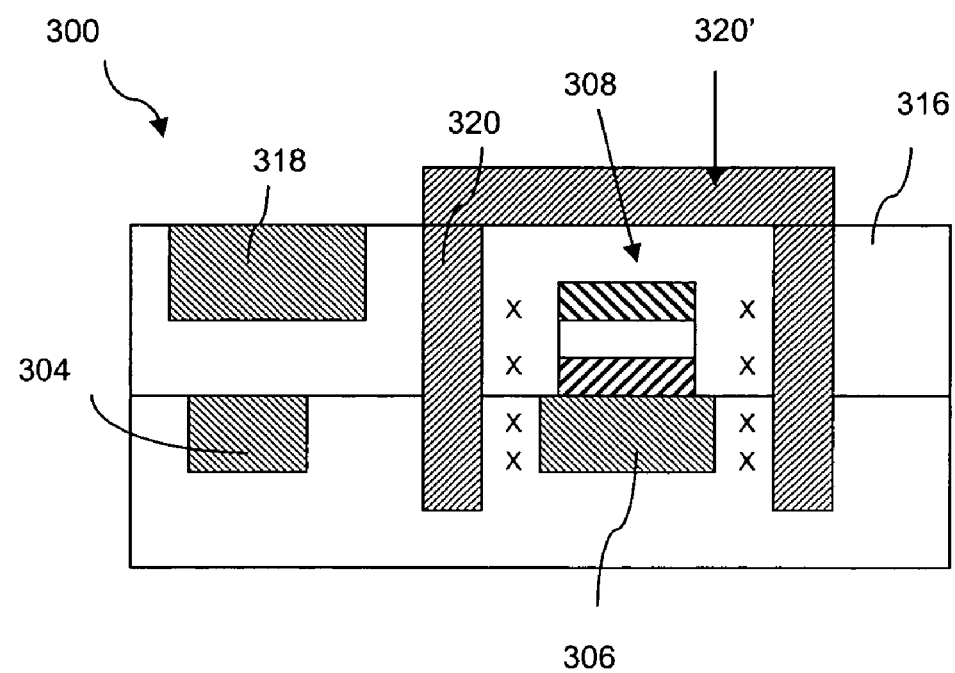
Figure 5B:
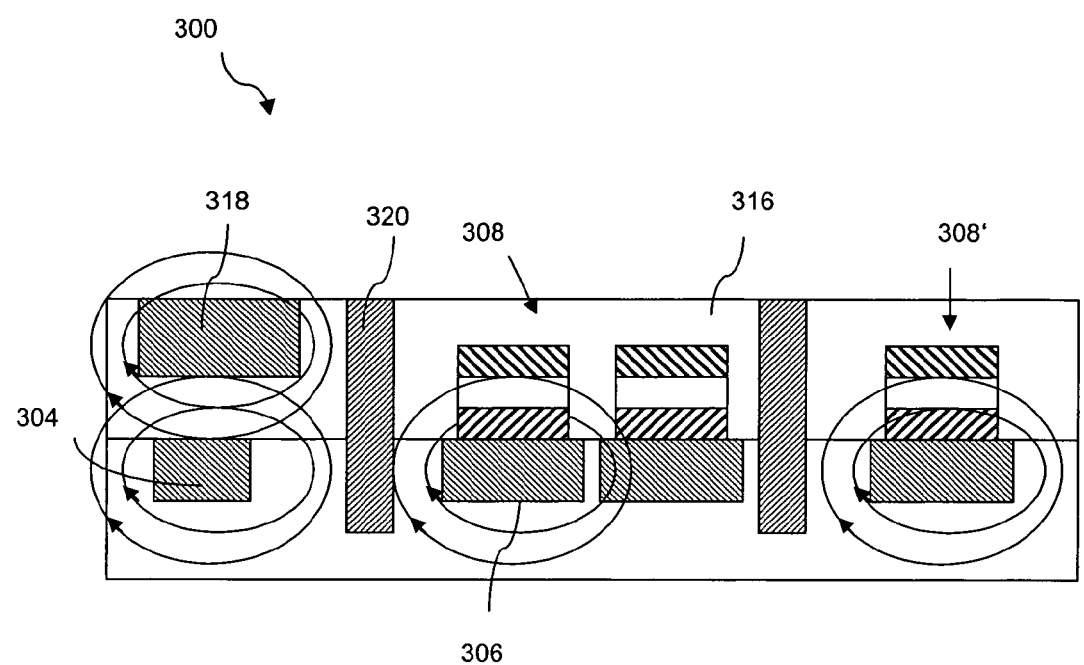

FIG. 5B is very similar to FIG. 5A except that the magnetic flux is represented by two con-centric circles that are substantially tangential to the shielding walls 320 on a different plane. It is further understood that no magnetic flux is in a perfect circular shape, the term "substantially tangential" only defines the spatial relationship between the radiation flux and the shielding mechanisms used, as it would be understood by one skilled in the art.

It is further understood that the shielding mechanisms such as the shielding walls can be placed in different layers of the semiconductor device. For example, the ring-shaped shielding around each bonding pad can be placed in a layer lower than the pad itself and still be effective for its intended function. Various alternatives can be implemented and one skilled in the art should be fully comprehensive of the spirit of this invention.

Referring to FIG. 5C, in some cases, the radiation patterns and strength of electromagnetic fields may vary for different metals. Metals with stronger electromagnetic fields may still cause interference for other components even with shielding walls implemented, since the radiation can travel over the shielding walls. For metallic components that emit such strong electromagnetic interferences, an optional cover shielding 320' may be implemented to prevent radiation from escaping from the top of the components.

The above invention provides many different embodiments or examples for implementing different features of magnetic shielding for semiconductor devices. Specific examples of components and processes are described to help clarify the methods and uses of this invention. These are, of course, merely examples of the invention and are not intended to limit the invention from that described in the claims.

Although illustrative embodiments of the magnetic shieldings and its example setup configuration have been shown and described, other modifications, changes and substitutions are intended in the foregoing invention. Accordingly, it is appropriate that the appended claims be construed broadly and in a manner consistent with the scope of the invention, as set forth in the following claims.

What is claimed is:

1. A semiconductor structure with an inter-cell and an inter-module radiation interference shielding mechanism comprising:
    a first circuit module formed over a substrate and producing a radiation field, the first circuit module including one or more memory cells;
    a dielectric layer formed over the first circuit module;
    at least one inter-cell radiation shielding wall placed between a radiation source of the memory cells and a circuit element vulnerable to a radiation field of the radiation source for reducing an inter-cell radiation interference, wherein the inter-cell radiation shielding wall further comprises a trench filled with a magnetic shielding material and formed through the dielectric layer into the substrate;
    a second circuit module interfered by the radiation field produced by the first circuit module; and
    at least one inter-module radiation shielding wall disposed between the first and second circuit modules that is substantially tangential to the radiation field for reducing the inter-module radiation interference.

2. The semiconductor structure of claim 1 wherein the first circuit module is a magnetic random access memory (MRAM) unit having at least one memory storage element.

3. The semiconductor structure of claim 2 wherein the memory storage element is a magnetic tunnel junction (MTJ) cell.

4. The semiconductor structure of claim 2 wherein the memory storage element is a spin valve magnetic memory cell.

5. The semiconductor structure of claim 1 wherein the inter-module radiation shielding wall confines the radiation field produced from the first circuit module including one or more memory cells.

6. The semiconductor structure of claim 1 wherein the inter-cell radiation shielding wall confines a radiation field produced from a device having an induced magnetic flux no greater than about 50 Oe.

7. The semiconductor structure of claim 1 wherein the second circuit module is an input/output pad.

8. The semiconductor structure of claim 7 wherein the inter-cell radiation shielding wall is of a ring shape placed around the second circuit module.

9. The semiconductor structure of claim 8 wherein the inter-cell radiation shielding wall is placed under the input/output pad.

10. A memory device having a shielding mechanism for preventing an inter-cell and an inter-module radiation interference, the memory device comprising:
    a first circuit module formed over a substrate and producing a radiation field, the first circuit module including one or more memory cells;
    a dielectric layer formed over the first circuit module;
    at least one inter-cell radiation shielding wall placed between a radiation source of the memory cells and a circuit element vulnerable to a radiation field of the radiation source for reducing an inter-cell radiation interference, wherein the inter-cell radiation shielding wall further comprises a trench filled with a magnetic shielding material and formed through the dielectric layer into the substrate;
    a second circuit module interfered by the radiation field produced by the first circuit module; and
    at least one inter-module radiation shielding wall disposed between the first and second circuit modules that is substantially tangential to the radiation field for reducing the inter-module radiation interference.

11. The memory device of claim 10 wherein the memory cell is an MTJ cell.

12. The memory device of claim 10 wherein the memory cell is a spin valve magnetic memory cell.

13. The memory device of claim 10 wherein the inter-cell radiation shielding wall confines a radiation field produced from a device having an induced magnetic flux no greater than about 50 Oe.

14. The memory device of claim 10 wherein the radiation source is an electrode of the memory cell.

15. The memory device of claim 10 wherein the inter-cell radiation shielding wall farther includes an upper part formed in the dielectric layer and a lower part formed in the substrate in alignment with the upper part.

16. The memory device of claim 10 wherein the second circuit module is an input/output pad.

17. The memory device of claim 16 wherein the inter-cell radiation shielding wall is of a ring shape placed around the second circuit module.

18. The memory device of claim 17 wherein the inter-cell radiation shielding wall is placed under the input/output pad.

19. A method for manufacturing a semiconductor device having a shielding mechanism for preventing an inter-cell and an inter-module interference caused by a radiation source, the method comprising:
 forming a first circuit module including one or more memory cells on a substrate, the first circuit module producing a radiation field;
 forming a dielectric layer over the first circuit module;
 forming one or more inter-cell shielding wall that is substantially tangential to the radiation field between a first component including the one or more memory cell and a second component including one or more interconnections for reducing a radiation interference therebetween, the inter-cell shielding wall being a trench filled with a magnetic shielding material and formed through the dielectric layer into the substrate; and
 forming a second circuit module interfered by the radiation field produced by the first circuit module;
 forming at least one or more inter-module shielding wall disposed between the first and second circuit modules that is substantially tangential to the radiation field for reducing the inter-module interference.

20. The method of claim 19 wherein the semiconductor device is a magnetic random access memory device cell.

* * * * *